US009277679B2

(12) United States Patent
Gu et al.

(10) Patent No.: US 9,277,679 B2
(45) Date of Patent: Mar. 1, 2016

(54) HEAT SINK FIN INCLUDING ANGULAR DIMPLES

(75) Inventors: Yuandong Gu, Plymouth, MN (US); Wei Yang, Minnetonka, MN (US)

(73) Assignee: Honeywell International Inc., Morris Plains, NJ (US)

( * ) Notice: Subject to any disclaimer, the term of this patent is extended or adjusted under 35 U.S.C. 154(b) by 1090 days.

(21) Appl. No.: 13/207,062

(22) Filed: Aug. 10, 2011

(65) Prior Publication Data

US 2012/0132410 A1    May 31, 2012

Related U.S. Application Data

(63) Continuation-in-part of application No. 12/955,449, filed on Nov. 29, 2010, now Pat. No. 9,111,918.

(51) Int. Cl.
| | |
|---|---|
| *F28F 7/00* | (2006.01) |
| *H05K 7/20* | (2006.01) |
| *H01L 21/48* | (2006.01) |
| *H01L 23/367* | (2006.01) |
| *H01L 23/467* | (2006.01) |

(52) U.S. Cl.
CPC ........ *H05K 7/20563* (2013.01); *H01L 21/4878* (2013.01); *H01L 21/4882* (2013.01); *H01L 23/3672* (2013.01); *H01L 23/467* (2013.01); *H01L 2924/0002* (2013.01); *Y10T 29/4935* (2015.01)

(58) Field of Classification Search
CPC ........... H05K 7/20563; H01L 21/4878; H01L 21/4882; H01L 23/3672; H01L 2924/0002; H01L 23/467; Y10T 29/4935

USPC ......................................................... 165/185
See application file for complete search history.

(56) References Cited

U.S. PATENT DOCUMENTS

| | | | |
|---|---|---|---|
| 4,296,455 A | 10/1981 | Leaycraft et al. | |
| 4,417,295 A | 11/1983 | Stuckert | |
| 4,800,956 A | 1/1989 | Hamburgen | |
| 4,851,965 A | 7/1989 | Gabuzda et al. | |
| 5,361,188 A | 11/1994 | Kondou et al. | |
| 5,428,503 A | 6/1995 | Matsushima et al. | |
| 5,560,424 A | 10/1996 | Ogawa | |

(Continued)

OTHER PUBLICATIONS

"U.S. Appl. No. 12/955,449 , Response filed Mar. 3, 2014 to Final Office Action mailed Dec. 20, 2013", 5 pgs.

(Continued)

*Primary Examiner* — Ljiljana Ciric
(74) *Attorney, Agent, or Firm* — Schwegman Lundberg & Woessner, P.A.

(57) ABSTRACT

A heat sink fin that has a first substrate. The first substrate includes a first angular dimple and a first micro air channel in fluid communication with the first angular dimple. The first angular dimple includes a first surface that forms an angle relative to a first plane of the first substrate. The first angular dimple includes a first micro diameter hole in fluid communication with the first angular dimple. The heat sink fin also has a second substrate folded against the first substrate. The second substrate includes a second angular dimple and a second micro air channel in fluid communication with the second angular dimple. The second angular dimple includes a second surface that forms an angle relative to a second plane of the second substrate. The second angular dimple includes a second micro diameter hole in fluid communication with the second angular dimple.

19 Claims, 11 Drawing Sheets

(56) References Cited

U.S. PATENT DOCUMENTS

| | | |
|---|---|---|
| 5,665,649 A | 9/1997 | Harris et al. |
| 5,731,954 A | 3/1998 | Cheon et al. |
| 6,131,646 A | 10/2000 | Kelley et al. |
| 6,352,103 B1 | 3/2002 | Chu et al. |
| 6,373,696 B1 | 4/2002 | Bolognia et al. |
| 6,378,605 B1 | 4/2002 | Kutscher et al. |
| 6,510,870 B1 * | 1/2003 | Valaszkai .............. B21C 37/151 165/183 |
| 6,538,885 B1 | 3/2003 | Azar |
| 6,538,892 B2 | 3/2003 | Smaic |
| 6,587,336 B2 | 7/2003 | Chu et al. |
| 6,622,785 B2 | 9/2003 | Haegele et al. |
| 6,684,942 B2 | 2/2004 | Song et al. |
| 6,765,796 B2 | 7/2004 | Hoffman et al. |
| 6,781,834 B2 | 8/2004 | Nair et al. |
| 6,817,405 B2 | 11/2004 | Kamath et al. |
| 6,886,249 B2 | 5/2005 | Smalc |
| 6,918,438 B2 | 7/2005 | Ellsworth, Jr. et al. |
| 7,000,427 B2 | 2/2006 | Mathias et al. |
| 7,222,423 B2 | 5/2007 | Ellsworth, Jr. |
| 7,284,596 B2 | 10/2007 | Larson |
| 8,376,031 B2 | 2/2013 | Yang et al. |
| 2002/0069661 A1 | 6/2002 | Livni |
| 2009/0025916 A1 * | 1/2009 | Meshenky ............. B21D 13/08 165/151 |
| 2009/0288807 A1 | 11/2009 | Yang et al. |
| 2012/0131979 A1 | 5/2012 | Yang et al. |

OTHER PUBLICATIONS

"U.S. Appl. No. 12/955,449, Non Final Office Action mailed Jun. 12, 2014", 7 pgs.

"U.S. Appl. No. 12/955,449, Response filed Sep. 9, 2014 to Non Final Office Action mailed Jun. 12, 2014", 8 pgs.

"U.S. Appl. No. 12/955,449, Final Office Action mailed Jan. 13, 2015", 10 pgs.

"U.S. Appl. No. 12/955,449, Notice of Allowance mailed Apr. 14, 2015", 7 pgs.

"U.S. Appl. No. 12/955,449, Response filed Feb. 19, 2015 to Final Office Action mailed Jan. 13, 2015", 7 pgs.

"U.S. Appl. No. 12/955,449, Final Office Action mailed Dec. 20, 2013", 6 pgs.

"U.S. Appl. No. 12/955,449, Response filed Aug. 26, 2013 to Not Final Office Action mailed May 24, 2013", 6 pgs.

"U.S. Appl. No. 12/955,449, Non Final Office Action mailed May 24, 2013", 5 pgs.

"U.S. Appl. No. 12/955,449, Response filed May 7, 2013 to Restriction Requirement mailed Apr. 11, 2013", 5 pgs.

"U.S. Appl. No. 12/955,449, Restriction Requirement mailed Apr. 11, 2013", 7 pgs.

* cited by examiner

HEAT SINK FIN INCLUDING ANGULAR DIMPLES

RELATED APPLICATIONS

The present application is a Continuation-In-Part of U.S. Pat. No. 9,111,918, which application is incorporated herein by reference in its entirety.

GOVERNMENT RIGHTS

This invention was made with United States Government support under Contract Number W31PQ4-09-C-0042. The United States Government has certain rights in this invention.

TECHNICAL FIELD

The present disclosure relates to a fin fabrication process for an entrainment heat sink.

BACKGROUND

In densely packed electronic systems, heat dissipation is a big challenge due to space constraints that preclude convective thermal solutions involving blowers or fans in proximity to the heat sources. For example, avionics systems with densely packed printed board assemblies (PBA), in which conventional onboard fans/blowers are too bulky to be placed, typically rely on conductive heat sinks made of solid metal plates. However, these solid metal plates are heavy and have limited performance capability.

DETAILED DESCRIPTION

This disclosure describes a method to fabricate fins for heat sinks, and in an embodiment, entrainment heat sinks. An entrainment heat sink is driven by compressed air, can be made in extremely low-profile, and thus is able to bring convective cooling to tight spaces previously only addressable by conductive cooling methods. The fins for the entrainment heat sink differ from conventional extruded structures in that they must contain micro air flow channels and nozzles that direct air jets predominately parallel to the fin surface and in the direction of the desired bulk air flow. The micro nozzles are connected via micro air channels that facilitate compressed air delivery. In an embodiment, the micro nozzles are fabricated on a substrate such as a metal foil and may be laminated on a plate, such as a metal plate, to form a fin. Other materials that can be used alone or in combination include various metals, graphite, ceramics, polymers, and composites. The micro air channels can be formed at the interface between the metal foil and the metal plate. In another embodiment, two layers of metal foil may be laminated together. Micro air channels are embossed on each of the metal foil layers.

Figure 1:
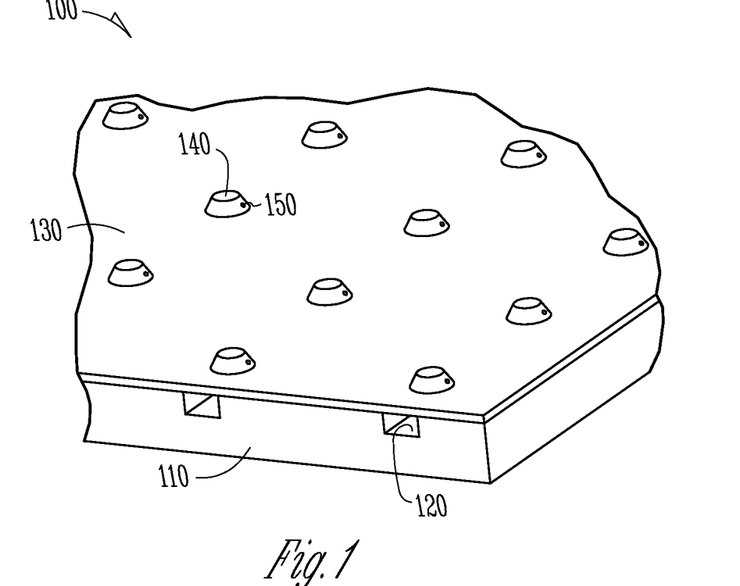
FIG. 1 is a perspective view an example embodiment of a heat sink including fabricated fins on a metal plate.
Figure 2:
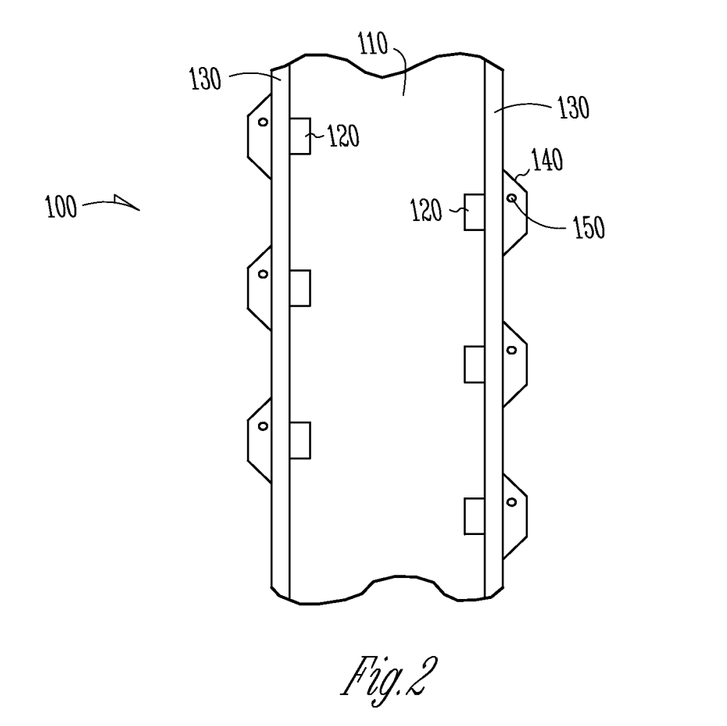
FIG. 2 is a side view of another example embodiment of a heat sink including fabricated fins on two sides of a metal plate.
Figure 3:
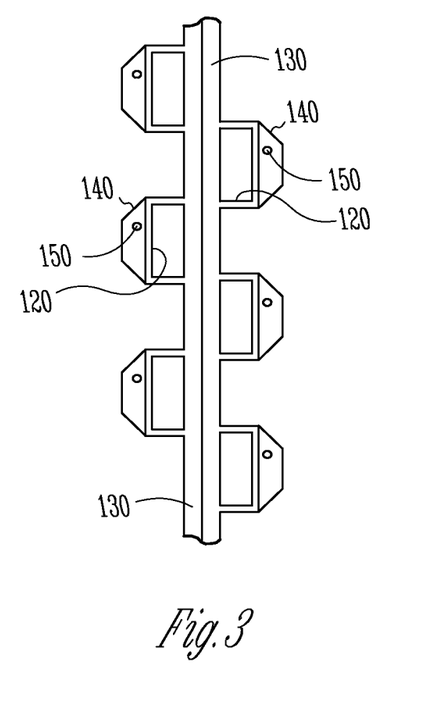
FIG. 3 is a side view of another example embodiment of a heat sink including two fabricated fins coupled together.

FIG. 1 illustrates an example embodiment of such a heat sink and fin combination. The heat sink 100 includes a metal plate 110 that includes micro air channels 120. A metal foil 130 is placed on the metal plate 110. The metal foil 130 includes angular dimples 140 that include on their angular faces air nozzles 150. FIG. 2 is a side view of such a heat sink and fin combination 100, and illustrates that micro air channels can be positioned on both sides of the metal plate 110 and that a metal foil 130 can be placed on both sides of the metal plate 110. FIG. 3 is a side view of another embodiment that includes two layers of metal foil 130 laminated to each other, with micro air channels 120 embossed on each layer and in communication with one or more angular dimples 140 with air nozzles 150.

The fabrication process starts by creating micro diameter holes on a metal foil using for example chemical etching, a laser, or electric discharge machining (EDM). In an embodiment, the metal foil is a copper foil. The copper foil has high thermal conductivity and is amenable to continuous variation of the jet angle. Other drilling methods such as sandblasting, the use of ultrasonic waves, a water jet, or micro milling/drilling machines can be used as well. The EDM method is generally preferred because of better precision and uniformity. These holes form the micro nozzles without specified orientations. The holes are approximately 20-50 micrometers in diameter. The nozzle orientation is created after the EDM drilling by stamping trapezoidal dimples in a mold. In an embodiment, the mold is a steel mold. In the stamping process the EDM hole is placed on the slanted side walls of the dimple, creating an angle from the fin base. Dimple side walls are slanted from 5 to 30 degrees from the vertical (or 60 to 85 degrees from the fin surface) in different sets of molds, thus giving various jet angles (polar). This method also allows azimuth control and allows continuous variation of the jet angles.

The metal foil that contains the micro nozzles can be laminated to a metal plate or another foil with similar micro nozzles. Micro-air channels, for the purpose of delivering compressed air, are formed at the interface of the lamination by, for example, machining, forming, embossing, or chemical etching trenches on the metal plate or the foil, and forming enclosed channels after lamination.

This fin fabrication process can be used to make entrainment heat sinks that have numerous application opportunities in high performance thermal management systems. Because such fins enable extremely low profile heat sinks, it is particularly suitable for space-constrained applications such as avionic systems with densely packed printed board assemblies (PBA) wherein conventional onboard fan/blowers are too bulky to fit.

In an embodiment, the copper foil after the dimple/nozzle formation is laminated onto a copper core which is about 0.5 mm thick and contains air channels that are in fluidic connection with the nozzle arrays. The fins may have nozzles on one side or both sides of the core. The fins can be fabricated in standard 1"×4" format and cut into various lengths according to specific heat sink designs.

Figure 4:
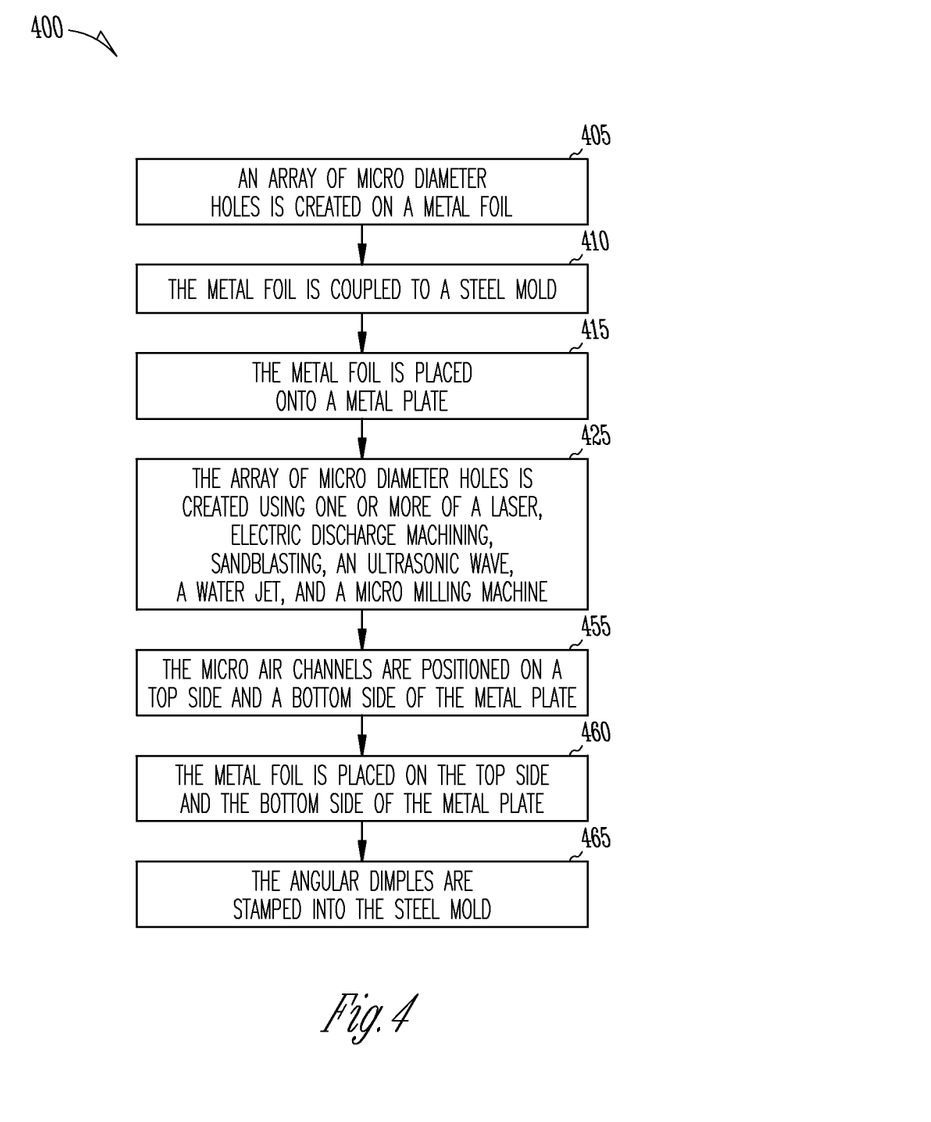
FIG. 4 is a flowchart of an example process to manufacture a heat sink.
Figure 5A:
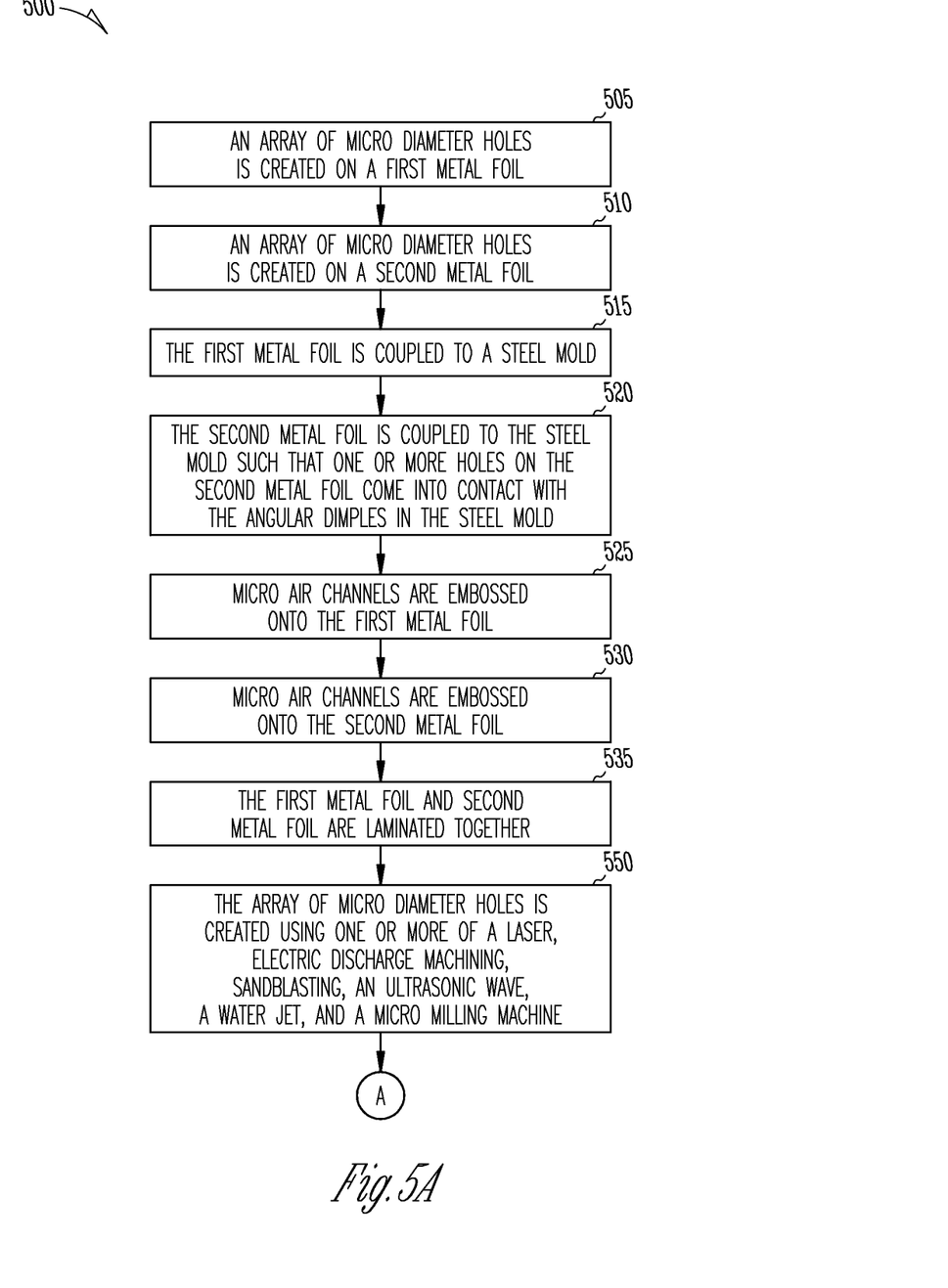
FIGS. 5A and 5B are a flowchart of another example process to manufacture a heat sink.
Figure 5B:
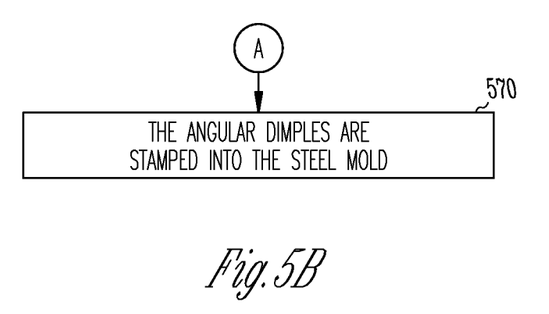

FIGS. 4 and 5 are flowcharts of example processes 400 and 500 for forming fins for an entrainment heat sink. FIGS. 4 and 5 include a number of process blocks 405-465 and 505-570 respectively. Though arranged serially in the examples of FIGS. 4 and 5, other examples may reorder the blocks, omit one or more blocks, and/or execute two or more blocks in parallel using multiple processors or a single processor organized as two or more virtual machines or sub-processors. Moreover, still other examples can implement the blocks as one or more specific interconnected hardware or integrated circuit modules with related control and data signals communicated between and through the modules. Thus, any process flow is applicable to software, firmware, hardware, and hybrid implementations.

Referring to FIG. 4, at 405, an array of micro diameter holes is created on a metal foil. At 410, the metal foil is coupled to a mold. The mold includes angular dimples such that one or more of the micro diameter holes on the metal foil come into contact with the angular dimples in the mold. This stamping of the metal foil with the mold forms an angle between the micro diameter holes and a surface of the metal foil. At 415, the metal foil is placed onto a metal plate. The metal plate includes micro air channels, and the micro air channels are in communication with the micro diameter holes.

At 420, the micro diameter holes comprise a diameter of approximately 20-50 micrometers. At 425, the array of micro diameter holes is created using one or more of a laser, electric discharge machining, sandblasting, an ultrasonic wave, a water jet, and a micro milling machine. At 430, the angular dimples comprise trapezoidal dimples. At 435, the one or more micro diameter holes form an angle ranging from 60 to 85 degrees from a surface of the metal foil. At 440, the metal foil comprises a copper foil, at 445, the metal plate comprises a copper plate, and at 450, the metal plate is approximately 0.5 mm thick. At 455, the micro air channels are positioned on a top side and a bottom side of the metal plate. At 460, the metal foil is placed on the top side and the bottom side of the metal plate. At 465, the angular dimples are stamped into the mold.

Referring to FIG. 5, at 505, an array of micro diameter holes is created on a first metal foil, and at 510, an array of micro diameter holes is created on a second metal foil. At 515, the first metal foil is coupled to a mold. The mold includes angular dimples such that one or more holes on the first metal foil come into contact with the angular dimples in the mold. This contact forms an angle between the holes on the first metal foil and a surface of the first metal foil. At 520, the second metal foil is coupled to the mold such that one or more holes on the second metal foil come into contact with the angular dimples in the mold. As with the first metal foil, this contact forms an angle between the holes of the second metal foil and a surface of the second metal foil. At 525, micro air channels are embossed onto the first metal foil. The micro air channels in the first metal foil are in communication with the micro diameter holes in the first metal foil. Similarly, at 530, micro air channels are embossed onto the second metal foil. The micro air channels in the second metal foil are in communication with the micro diameter holes in the second metal foil. At 535, the first metal foil and second metal foil are laminated together.

At 540, the micro diameter holes of the first metal foil are in communication with the micro diameter holes of the second metal foil. At 545, the micro diameter holes comprise a diameter of approximately 20-50 micrometers. At 550, the array of micro diameter holes is created using one or more of a laser, electric discharge machining, sandblasting, an ultrasonic wave, a water jet, and a micro milling machine. At 555, the angular dimples comprise trapezoidal dimples. At 560, the micro diameter holes of the first metal foil and the micro diameter holes of the second metal foil form angles ranging from 60 to 85 degrees from a surface of the first metal foil and the second metal foil. At 565, the first metal foil and/or the second metal foil comprise a copper foil. At 570, the angular dimples are stamped into the steel mold.

FIGS. 6-10 illustrate a heat sink fin 600 according to an example embodiment. The heat sink fin 600 has a first substrate 610 that includes a first angular dimple 611 and a first micro air channel 612 in fluid communication with the first angular dimple 611. The first angular dimple 611 includes a first surface 613 that forms an angle relative to a first plane of the first substrate 610. The first angular dimple 611 includes a first micro diameter hole 614 that is in fluid communication with an interior of the first angular dimple 611.

Figure 9:
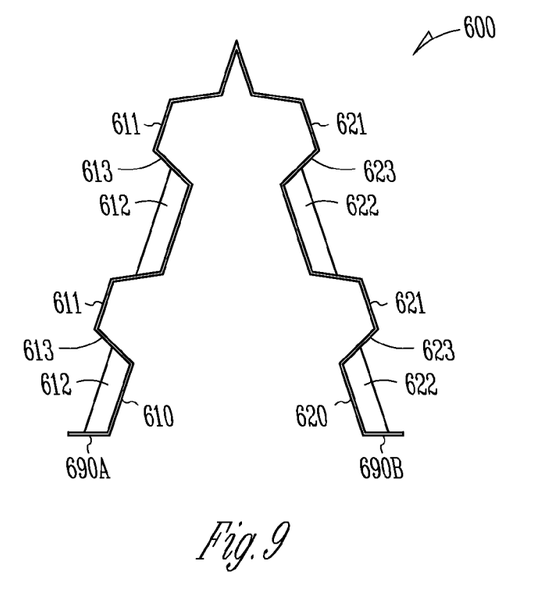
FIG. 9 is a side view the heat sink fin shown in FIG. 6 where the heat sink fin is partially folded.
Figure 10:
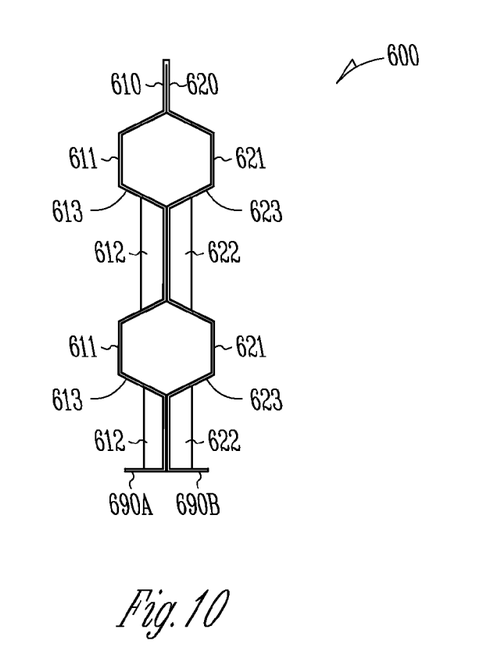
FIG. 10 is a side view the heat sink fin shown in FIG. 9 where the heat sink fin is fully folded.

The heat sink fin 600 also has a second substrate 620 that is folded against the first substrate 610 (shown partially folded in FIG. 9 and fully folded in FIG. 10). The second substrate 620 includes a second angular dimple 621 and a second micro air channel 622 in fluid communication with the second angular dimple 621. The second angular dimple 621 further includes a second surface 623 that forms an angle relative to a second plane of the second substrate 620. The second angular dimple 621 includes a second micro diameter hole 624 that is in fluid communication with the second angular dimple 621.

In the example embodiment that is illustrated in FIGS. 6-10, the heat sink fin 600 further includes a first spacer section 690A that is foldably connected to the first substrate 610 and a second spacer section 690B that is foldably connected to the second substrate 620. The relative size and shape of first and second spacer sections 690A, 690B will depend in part on the overall configuration of the heat sink (not shown) and where the heat sink fin 600 is to be used (among other factors).

As shown most clearly in FIG. 10, when the heat sink fin 600 is in the fully folded position, the first spacer section 690A is orthogonal to the first plane of the first substrate 610, and the second spacer section 690B is orthogonal to the second plane of the second substrate 620. The first and second spacer sections 690A, 690B allow the heat sink fin 600 to be readily mounted to other portions of the heat sink (e.g., by soldering).

In the example embodiment that is illustrated in FIGS. 6-10, the first substrate 610 includes a first plurality of first angular dimples 611 such that each first angular dimple 611 has a micro air channel 612 in fluid communication with the first angular dimples 611, and each first angular dimple 611 includes a first surface 613 that forms an angle relative to the first plane of the first substrate 610. Each first angular dimple 611 also includes a first micro diameter hole 614 that is in fluid communication with the respective first angular dimple 611.

In addition, the second substrate 620 includes a second plurality of second angular dimples 621 such that each second angular dimple 621 has a second micro air channel 622 in fluid communication with one of the respective second angular dimples 621, and each second angular dimple 621 includes a second surface 623 that forms an angle relative to the second plane of the second substrate 620. Each second angular dimple 621 includes a second micro diameter hole 624 that is in fluid communication with the respective second angular dimple 621.

As an example, each first angular dimple 611 in the first plurality of angular dimples 611 may be aligned with another second angular dimple 621 in the second plurality of second angular dimples 621, although embodiments are contemplated where the respective first and second angular dimples 611, 621 are partially aligned or not aligned at all.

It should be noted that the number, size, type and orientation of the first and second angular dimples 611, 621; first and second micro air channels 611, 621; and first and second micro diameter holes 614, 624 may vary depending on the overall design considerations associated with a particular embodiment of the heat sink fin 600. In addition, the desired heat transfer of the heat sink that includes the heat sink fin 600 will affect the required overall size and quantity of the first and second angular dimples 611, 621; first and second micro air channels 611, 621; and first and second micro diameter holes 614, 624.

In some embodiments, the first surface 613 of the first angular dimple 611 forms an angle between 60 and 85 degrees relative to the first plane of the first substrate 610. In addition, the second surface 623 of the second angular dimple 621 forms an angle between 60 and 85 degrees relative to the second plane of the second substrate 620.

The first substrate 610 and the second substrate 620 may be the same or different materials. As an example, the first substrate 610 and the second substrate 620 may be formed of copper foil that is readily folded. In addition, the first and/or second micro diameter holes 614, 624 may have a diameter that is between 20 and 50 micrometers.

Figure 11:
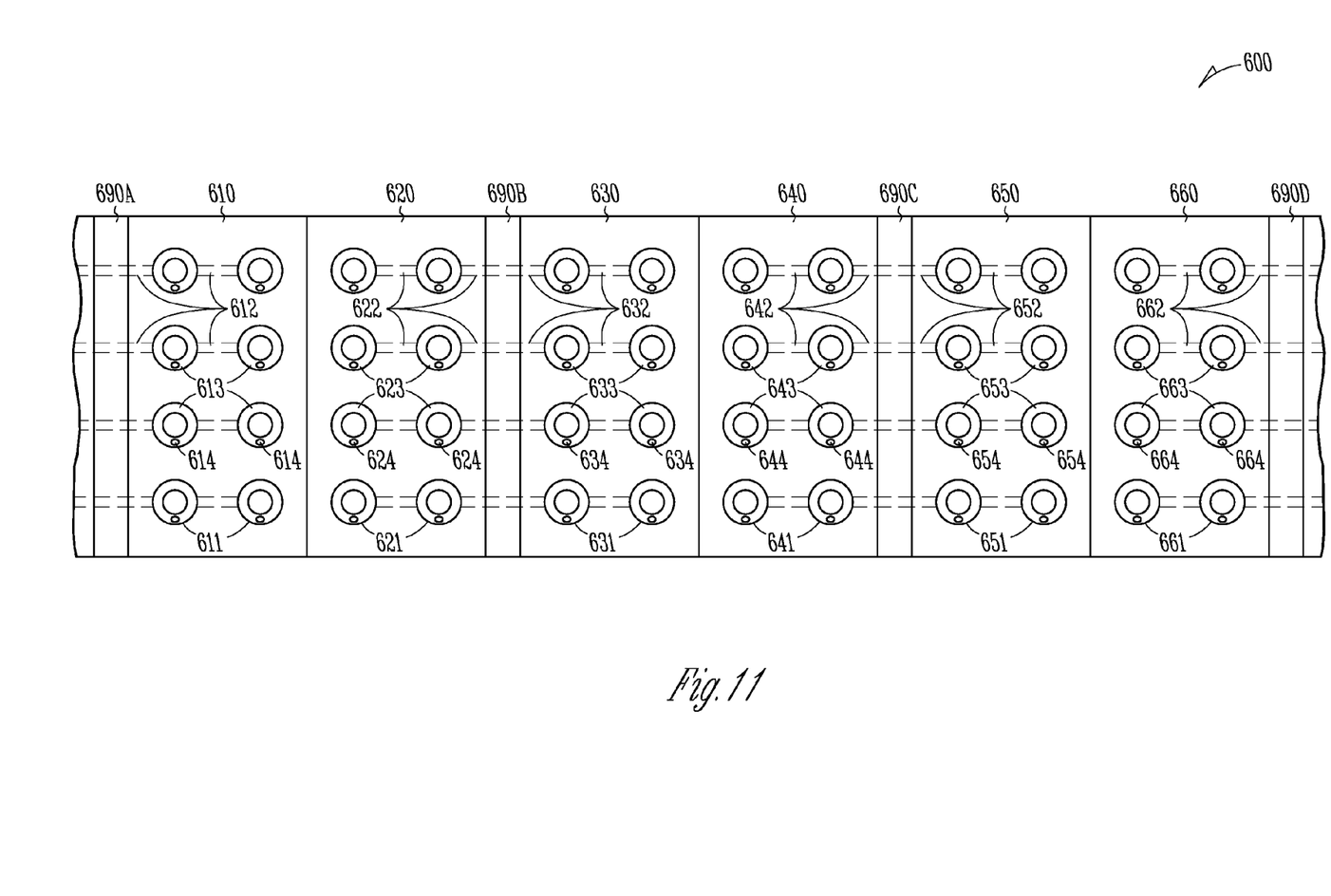
FIG. 11 a top view of an unfolded heat sink fin according to another example embodiment.
Figure 12:
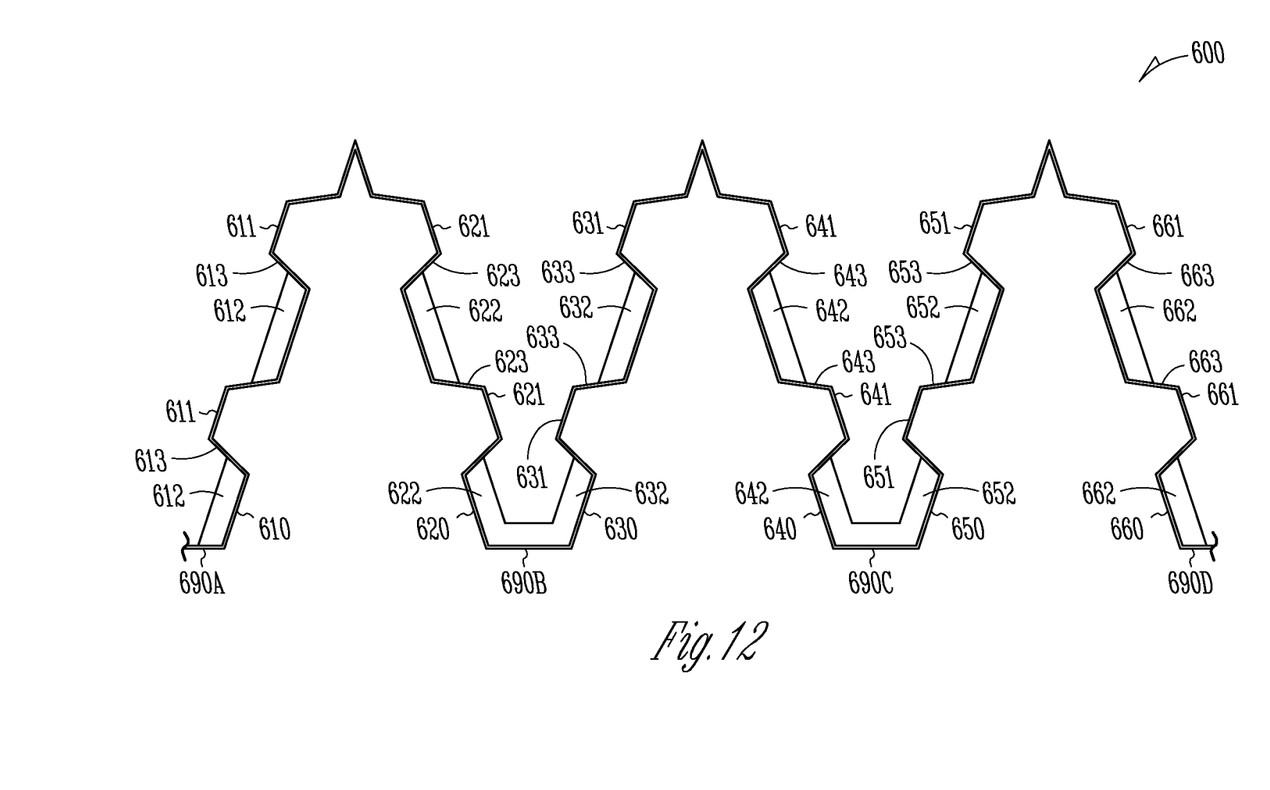
FIG. 12 is a side view the heat sink fin shown in FIG. 11 where the heat sink fin is partially folded.
Figure 13:
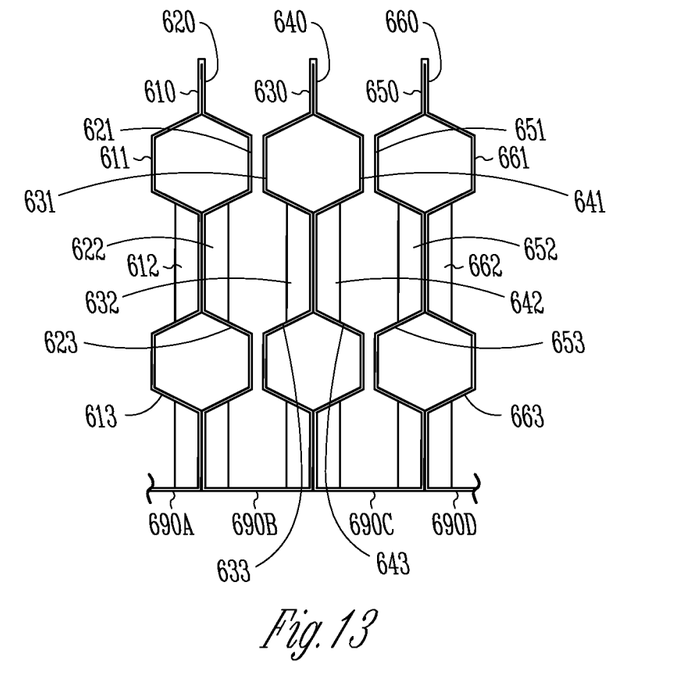
FIG. 13 is a side view the heat sink fin shown in FIG. 12 where the heat sink fin is fully folded.

FIGS. 11-13 show an example embodiment where the heat sink fin 600 further includes a third substrate 630 that is foldably connected to the second spacer section 690B. The third substrate 630 includes a third angular dimple 631 (a plurality of third angular dimples 631 are shown in FIG. 11) and a third micro air channel 632 (a plurality of micro air channels 632 are shown in FIG. 11) in fluid communication with the third angular dimple 631. The third angular dimple 631 includes a third surface 633 that forms an angle relative to a third plane of the third substrate 630. Each third angular dimple 631 includes a third micro diameter hole 634 that is in fluid communication with an interior of the third angular dimple 631.

The heat sink fin 600 further includes a fourth substrate 640 that is folded against the third substrate 630 (shown partially folded in FIG. 12 and fully folded in FIG. 13). The fourth substrate 640 includes a fourth angular dimple 641 (a plurality of fourth angular dimples 641 are shown in FIG. 11) and a fourth micro air channel (a plurality of micro air channels 642 are shown in FIG. 11) in fluid communication with the fourth angular dimple 641. The fourth angular dimple 641 includes a fourth surface 643 that forms an angle relative to a fourth plane of the fourth substrate 640. The fourth angular dimple 641 includes a fourth micro diameter hole 644 that is in fluid communication with the fourth angular dimple 641.

As an example, each fourth angular dimple 641 on the fourth substrate 640 may be aligned with another third angular dimple 631 on the third substrate 630, although embodiments are contemplated where the respective third and fourth angular dimples 631, 641 are partially aligned or not aligned at all. In addition, the third and/or fourth angular dimples 631, 641 on the third and fourth substrates 630, 640 may be partially, wholly or not aligned with the first and second angular dimples 611, 621 on the first and second substrates 610, 620.

In the example embodiment that is illustrated in FIGS. 11-13, a third spacer section 690C may be foldably connected to the fourth substrate 640, especially in embodiments where the heat sink fin 600 includes additional folded substrates. As an example, the heat sink fin 600 further includes a fifth substrate 650 that is foldably connected to the third spacer section 690C. The fifth substrate 650 includes a fifth angular dimple 651 (a plurality of fifth angular dimples 651 are shown in FIG. 11) and a fifth micro air channel 652 (a plurality of micro air channels 652 are shown in FIG. 11) in fluid communication with the fifth angular dimple 651. The fifth angular dimple 651 includes a fifth surface 653 that forms an angle relative to a fifth plane of the fifth substrate 650. The fifth angular dimple 651 includes a fifth micro diameter hole 654 that is in fluid communication with an interior of the fifth angular dimple 651.

The heat sink fin 600 further includes a sixth substrate 660 that is folded against the fifth substrate 650 (shown partially folded in FIG. 12 and fully folded in FIG. 13). The sixth substrate 660 includes a sixth angular dimple 661 (a plurality of sixth angular dimples 661 are shown in FIG. 11) and a sixth micro air channel 662 (a plurality of micro air channels 662 are shown in FIG. 11) in fluid communication with the sixth angular dimple 661. The sixth angular dimple 661 includes a sixth surface 663 that forms an angle relative to a sixth plane of the sixth substrate 660. The sixth angular dimple 661 includes a sixth micro diameter hole 664 that is in fluid communication with an interior of the sixth angular dimple 661.

Each sixth angular dimple 661 on the sixth substrate 660 may be aligned with another fifth angular dimple 651 on the fifth substrate 650, although embodiments are contemplated where the respective sixth and fifth angular dimples 661, 651 are partially aligned or not aligned at all. In addition, the fifth and sixth angular dimples 651, 661 on the fifth and sixth substrates 650, 660 may be partially, wholly or not aligned with the first, second, third and/or fourth angular dimples 611, 621, 631, 641 on the first, second, third and fourth substrates 610, 620, 630, 640.

In the example embodiment that is illustrated in FIGS. 11-13, a fourth spacer section 690D may be foldably connected to the sixth substrate 660, especially in embodiments where the heat sink fin 600 includes additional folded substrates. It should be noted that embodiments are contemplated where the heat sink 600 includes additional folded substrates and spacer sections. The configuration of the heat sink fin 600 allows for ease of fabrication of any number of heat sink fins 600 and folded substrates.

Figure 6:
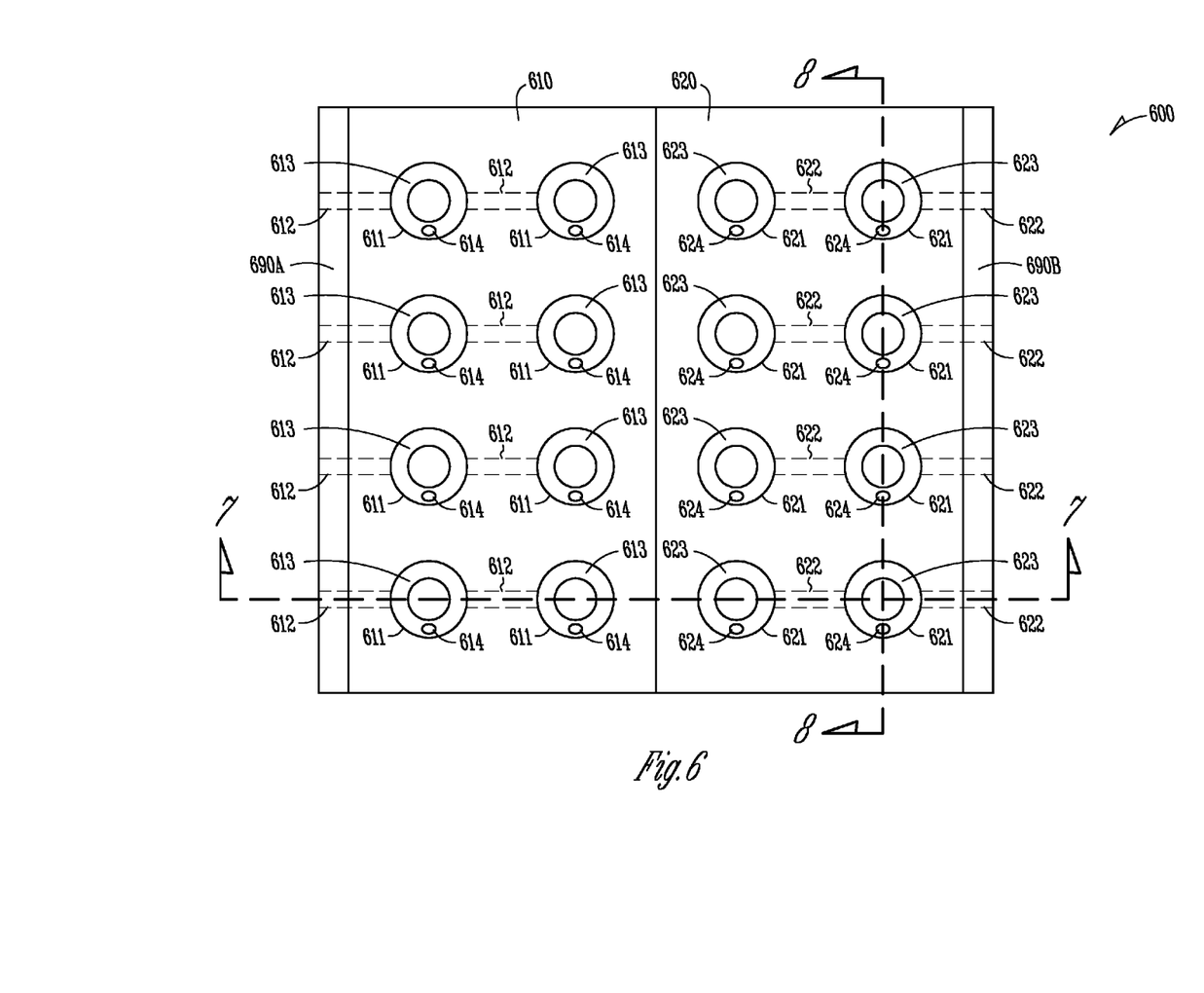
FIG. 6 a top view of an unfolded heat sink fin according to an example embodiment.
Figures 7, 8:
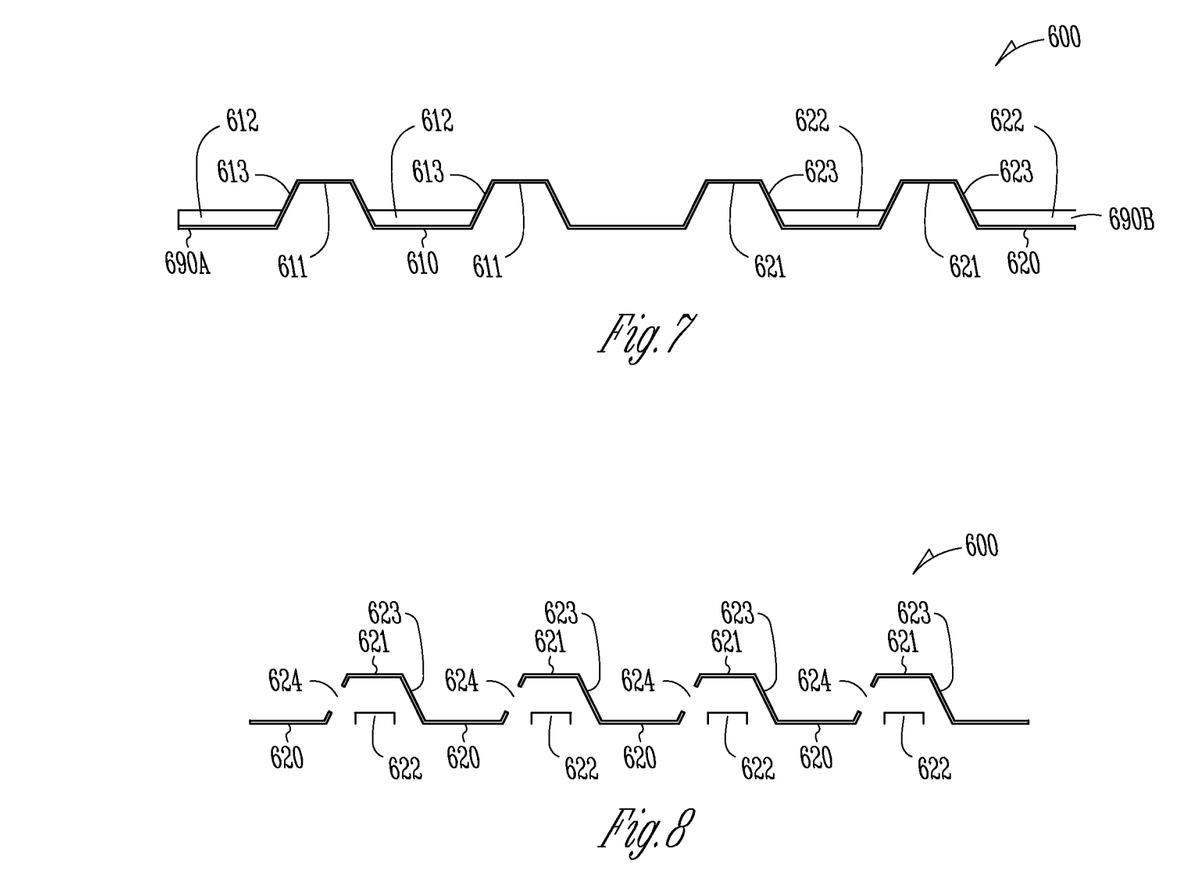
FIG. 7 is a section view the heat sink fin shown in FIG. 6 taken along line 7-7.
FIG. 8 is a section view the heat sink fin shown in FIG. 6 taken along line 8-8.

Other embodiments relate to a method of forming a heat sink fin 600. The method includes creating an array of micro diameter holes on a copper foil. FIG. 6 shows example micro diameter holes 614, 624 and FIG. 11 shows example micro diameter holes 614, 624, 634, 644, 654, 664.

The method further includes coupling the copper foil to a mold that includes angular protrusions such that the micro diameter holes on the copper foil come into contact with the angular protrusions in the mold to form angular dimples on the copper foil. FIG. 6 shows example angular dimples 611, 621 and FIG. 11 shows example angular dimples 611, 621, 631, 641, 651, 661.

The method further includes embossing micro air channels in the copper foil such that the micro air channels are in fluid communication with the angular dimples and the micro diameter holes in the copper foil. FIG. 6 shows example micro air channels 612, 622 and FIG. 11 shows example micro air channels 612, 622, 632, 642, 652, 662.

The method further includes folding the copper foil to form a first substrate that includes a first plurality of angular dimples and a second substrate that includes a second plurality of angular dimples where the second substrate is folded against the first substrate. FIGS. 10 and 13 show example first and second substrates 610, 620 folded against one another.

In some embodiments, folding the copper foil includes folding the copper foil such that each angular dimple in the first plurality of angular dimples is aligned with another angular dimple in the second plurality of angular dimples. As shown in FIG. 10, first angular dimples 611 on the first substrate 610 are aligned with second angular dimples 621 on the second substrate 620 when the first substrate 610 is folded against the second substrate 620.

In the example embodiment that is illustrated in FIGS. 11-13, folding the copper foil may further include forming a third substrate 630 that includes a third plurality of angular dimples 631 and a fourth substrate 640 that includes a fourth plurality of angular dimples 641. The fourth substrate 640 is folded against the third substrate and a second spacer section 690B is between the second substrate 620 and the third substrate 630.

FIGS. 11-13 also show that folding the copper foil may further include forming a fifth substrate 650 that includes a fifth plurality of angular dimples 651 and a sixth substrate 660 that includes a sixth plurality of angular dimples 661. The sixth substrate 660 is folded against the fifth substrate 650 and a third spacer section 690C is between the fourth substrate 640 and the fifth substrate 650.

In some embodiments, folding the copper foil includes folding the copper foil such that each fifth angular dimple 651 in the plurality of fifth angular dimples is aligned with another sixth angular dimple 661 in the plurality of sixth angular dimples. In addition, each angular dimple 651, 661 in the plurality of fifth and sixth angular dimples may be partially, wholly or not aligned with the first, second, third and/or fourth angular dimples 611, 621, 631, 641 on the respective first, second, third and fourth substrates 610, 620, 630, 640.

It should be understood that there exist implementations of other variations and modifications of the invention and its various aspects, as may be readily apparent, for example, to those of ordinary skill in the art, and that the invention is not limited by specific embodiments described herein. Features and embodiments described above may be combined with each other in different combinations. It is therefore contemplated to cover any and all modifications, variations, combinations or equivalents that fall within the scope of the present invention.

The Abstract is provided to comply with 37 C.F.R. §1.72(b) and will allow the reader to quickly ascertain the nature and gist of the technical disclosure. It is submitted with the understanding that it will not be used to interpret or limit the scope or meaning of the claims.

The invention claimed is:

1. A heat sink fin comprising:
a first substrate;
a second substrate folded against the first substrate, wherein the first substrate and the second substrate each include an angular dimple and a micro air channel in fluid communication with the angular dimple, wherein each angular dimple includes a surface that forms an angle relative to a plane of the corresponding substrate, wherein the each angular dimple includes a micro diameter hole.

2. The heat sink fin of claim 1 wherein the angular dimple of the first substrate is aligned with the angular dimple of the second substrate.

3. The heat sink fin of claim 1 further comprising:
a first spacer section foldably connected to the first substrate; and
a second spacer section foldably connected to the second substrate.

4. The heat sink fin of claim 3 wherein the first spacer section is orthogonal to the plane of the first substrate, and the second spacer section is orthogonal to the plane of the second substrate.

5. The heat sink fin of claim 3 further comprising:
a third substrate foldably connected to the second spacer section; and
a fourth substrate folded against the third substrate, wherein the first substrate and the fourth substrate each include an angular dimple and a micro air channel, wherein each angular dimple includes a surface that forms an angle relative to a plane of the corresponding substrate.

6. The heat sink fin of claim 5 wherein the angular dimple of the third substrate is aligned with the angular dimple of the fourth substrate.

7. The heat sink fin of claim 6 wherein all of the angular dimples are aligned with each other.

8. The heat sink fin of claim 5 further comprising a third spacer section foldably connected to the fourth substrate.

9. The heat sink fin of claim 8 wherein the third spacer section is orthogonal to the plane of the fourth substrate.

10. The heat sink fin of claim 9 further comprising:
a fifth substrate foldably connected to the third spacer section; and
a sixth substrate folded against the fifth substrate, wherein the fifth substrate and the sixth substrate each include an angular dimple and a micro air channel wherein each angular dimple includes a surface that forms an angle relative to a plane of the corresponding substrate.

11. The heat sink fin of claim 10 wherein the angular dimple of the fifth substrate is aligned with the angular dimple of the sixth substrate.

12. The heat sink fin of claim 11 wherein all of the angular dimples are aligned with each other.

13. The heat sink fin of claim 10 further comprising a fourth spacer section foldably connected to the sixth substrate.

14. The heat sink fin of claim 13 wherein the fourth spacer section is orthogonal to the sixth plane of the sixth substrate.

15. The heat sink fin of claim 1 wherein the first substrate and the second substrate are formed of copper foil.

16. The heat sink fin of claim 1 wherein the micro diameter holes each have a diameter between 20 and 50 micrometers.

17. The heat sink fin of claim 1 wherein the surface of each angular dimple forms an angle of between 60 and 85 degrees relative to the plane of the corresponding substrate.

18. A heat sink fin comprising:
a first substrate;
a second substrate folded against the first substrate, wherein the first substrate and the second substrate each include a plurality of angular dimples such that each angular dimple has a micro air channel, wherein each angular dimple includes a surface that forms an angle relative to a plane of the corresponding substrate.

19. The heat sink fin of claim 18 wherein each angular dimple on the first substrate is aligned with one of the angular dimples on the second substrate.

* * * * *